(12) United States Patent
Abe et al.

(10) Patent No.: US 10,306,790 B2
(45) Date of Patent: May 28, 2019

(54) CASING COMPONENT, ELECTRONIC APPARATUS, AND CASING COMPONENT PRODUCTION METHOD

(71) Applicant: SONY CORPORATION, Tokyo (JP)

(72) Inventors: Atsuhiro Abe, Kanagawa (JP); Fujio Kobayashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 133 days.

(21) Appl. No.: 15/503,423

(22) PCT Filed: May 26, 2015

(86) PCT No.: PCT/JP2015/002652
§ 371 (c)(1),
(2) Date: Feb. 13, 2017

(87) PCT Pub. No.: WO2016/027391
PCT Pub. Date: Feb. 25, 2016

(65) Prior Publication Data
US 2017/0231105 A1 Aug. 10, 2017

(30) Foreign Application Priority Data

Aug. 21, 2014 (JP) .................................. 2014-168136

(51) Int. Cl.
*B32B 1/02* (2006.01)
*B32B 3/30* (2006.01)
(Continued)

(52) U.S. Cl.
CPC ....... *H05K 5/0243* (2013.01); *B29C 45/1418* (2013.01); *B29C 45/14688* (2013.01);
(Continued)

(58) Field of Classification Search
CPC ...... H05K 5/0243; H05K 5/02; B29C 45/148; H01Q 1/12; H01Q 1/36; H01Q 1/44;
(Continued)

(56) References Cited

U.S. PATENT DOCUMENTS 4,118,704 A * 10/1978 Ishino .................. H01Q 17/008
342/4
5,204,680 A * 4/1993 Allington ........... H01Q 15/0006
342/4
(Continued)

FOREIGN PATENT DOCUMENTS

JP 2006-287500 A 10/2006
JP 2010-148009 A 7/2010
(Continued)

OTHER PUBLICATIONS

International Search Report and Written Opinion of PCT Application No. PCT/JP2015/002652, dated Sep. 1, 2015, 08 pages of English Translation and 07 pages of ISRWO.
(Continued)

*Primary Examiner* — Timothy J Thompson
*Assistant Examiner* — Michael F McAllister
(74) *Attorney, Agent, or Firm* — Chip Law Group

(57) ABSTRACT

A casing component according to an embodiment of the present technology includes a to-be-decorated area and a decoration portion. The to-be-decorated area includes a plurality of to-be-decorated surfaces to be decorated, the plurality of to-be-decorated surfaces being formed such that adjacent to-be-decorated surfaces have different heights. The decoration portion includes a metal layer formed in each of the plurality of to-be-decorated surfaces.

14 Claims, 12 Drawing Sheets

(51) Int. Cl.
| | |
|---|---|
| *B32B 7/12* | (2006.01) |
| *B32B 15/04* | (2006.01) |
| *B32B 27/08* | (2006.01) |
| *B44C 1/24* | (2006.01) |
| *H01Q 1/12* | (2006.01) |
| *H04B 1/38* | (2015.01) |
| *H04B 1/3888* | (2015.01) |
| *H05K 5/02* | (2006.01) |
| *B29C 45/14* | (2006.01) |
| *B44C 1/17* | (2006.01) |
| *H04M 1/02* | (2006.01) |
| *B32B 27/30* | (2006.01) |
| *B29K 55/02* | (2006.01) |
| *B29K 69/00* | (2006.01) |
| *B29L 31/00* | (2006.01) |

(52) U.S. Cl.
CPC .......... *B29C 45/14827* (2013.01); *B32B 1/02* (2013.01); *B32B 3/30* (2013.01); *B32B 7/12* (2013.01); *B32B 15/04* (2013.01); *B32B 27/08* (2013.01); *B32B 27/302* (2013.01); *B32B 27/308* (2013.01); *B44C 1/1712* (2013.01); *B44C 1/24* (2013.01); *H01Q 1/12* (2013.01); *H04B 1/38* (2013.01); *H04B 1/3888* (2013.01); *H04M 1/0202* (2013.01); *H04M 1/0283* (2013.01); *B29K 2055/02* (2013.01); *B29K 2069/00* (2013.01); *B29L 2031/7162* (2013.01); *B32B 2250/02* (2013.01); *B32B 2250/24* (2013.01); *B32B 2255/205* (2013.01); *B32B 2255/26* (2013.01); *B32B 2255/28* (2013.01); *B32B 2270/00* (2013.01); *B32B 2307/20* (2013.01); *B32B 2307/412* (2013.01); *B32B 2307/416* (2013.01); *B32B 2451/00* (2013.01); *B32B 2457/00* (2013.01)

(58) Field of Classification Search
CPC ............ B29K 2055/02; B29K 2069/00; B29L 2031/7162; H04B 1/38
USPC .................................................... 361/679.01
See application file for complete search history.

(56) References Cited

U.S. PATENT DOCUMENTS

| | | | | |
|---|---|---|---|---|
| 9,030,366 | B2* | 5/2015 | Ito | H01Q 1/52 343/787 |
| 9,343,815 | B2* | 5/2016 | Watts | H01Q 15/147 |
| 9,924,601 | B2* | 3/2018 | Ostholt | C25D 5/00 |
| 2010/0156732 | A1 | 6/2010 | Ito et al. | |
| 2012/0064353 | A1* | 3/2012 | Kawaguchi | B32B 27/08 428/446 |
| 2014/0268525 | A1* | 9/2014 | Hwang | B29C 45/0053 361/679.01 |
| 2015/0325921 | A1* | 11/2015 | Watts | H01Q 15/147 342/5 |

FOREIGN PATENT DOCUMENTS

| | | |
|---|---|---|
| JP | 2010-230661 A | 10/2010 |
| JP | 2010-251899 A | 11/2010 |
| JP | 4843612 B2 | 12/2011 |
| JP | 2014-060237 A | 4/2014 |
| KR | 10-2008-0049103 A | 6/2008 |
| KR | 10-0993969 B1 | 11/2010 |
| WO | 2007/032252 A1 | 3/2007 |

OTHER PUBLICATIONS

International Preliminary Report on Patentability of PCT Application No. PCT/JP2015/002652, dated Mar. 2, 2017, 08 pages of English Translation and 04 pages of IPRP.

* cited by examiner

|  | Measurement value | Reference value | Attenuation (difference) |
|---|---|---|---|
|  | dB | dB | dB |
| None | -9.8 | -9.8 | 0 |
| Indium foil | -11.4 | -9.8 | -1.6 |
| Step of sample A 50μm | -11.3 | -9.8 | -1.5 |
| Step of sample B 30μm | -11.2 | -9.8 | -1.4 |
| Aluminum foil | -36.3 | -9.8 | -26.5 |
| Aluminum plate | -36.2 | -9.8 | -26.4 |

CASING COMPONENT, ELECTRONIC APPARATUS, AND CASING COMPONENT PRODUCTION METHOD

CROSS REFERENCE TO RELATED APPLICATIONS

This application is a U.S. National Phase of International Patent Application No. PCT/JP2015/002652 filed on May 26, 2015, which claims priority benefit of Japanese Patent Application No. JP 2014-168136 filed in the Japan Patent Office on Aug. 21, 2014. Each of the above-referenced applications is hereby incorporated herein by reference in its entirety.

TECHNICAL FIELD

The present technology relates to a casing component applicable to an electronic apparatus, an electronic apparatus to which the casing component is applied, and a casing component production method.

BACKGROUND ART

From the past, a member capable of transmitting millimeter electromagnetic waves and the like while having a metallic appearance has been contrived as a casing component of electronic apparatuses and the like. For example, Patent Literature 1 discloses an exterior component for mounting an automotive radar on an automotive emblem. For example, indium is vapor-deposited on a resin film, and this film is attached to a surface layer of the emblem by an insert molding method. As a result, it becomes possible to produce an exterior component that has metallic luster and does not have an absorption range in an electromagnetic wave frequency band due to an island-like configuration of indium (paragraph [0006] in specification of Patent Literature 1 etc.).

Patent Literature 1 also discloses the following technology. Specifically, a sea-island configuration in which metal regions are islands and a nonmetal region surrounding the islands is the sea is formed artificially while having regularity. In addition, the metal regions are insulated from one another by the nonmetal region, and areas of the metal regions and distances among the adjacent metal regions are controlled appropriately. There is a description that a material having electromagnetic wave permeability that compares well with a film onto which indium is vapor-deposited can consequently be obtained (paragraph [0013] in specification of Patent Literature 1 etc.).

CITATION LIST

Patent Literature

Patent Literature 1: Japanese Patent Application Laid-open No. 2010-251899

DISCLOSURE OF INVENTION

Technical Problem

There is required a casing component capable of transmitting radio waves while having metallic luster.

In view of the circumstances as described above, the present technology aims at providing a casing component that has a high design property and is capable of transmitting radio waves while having a metallic appearance, an electronic apparatus to which the casing component is applied, and a casing component production method.

Solution to Problem

To attain the object described above, according to an embodiment of the present technology, there is provided a casing component including a to-be-decorated area and a decoration portion.

The to-be-decorated area includes a plurality of to-be-decorated surfaces to be decorated, the plurality of to-be-decorated surfaces being formed such that adjacent to-be-decorated surfaces have different heights.

The decoration portion includes a metal layer formed in each of the plurality of to-be-decorated surfaces.

In the casing component, the adjacent to-be-decorated surfaces are formed to have different heights in the to-be-decorated area. Therefore, it is possible to transmit radio waves even when the to-be-decorated surfaces are in contact with one another and thus realize a casing component that has a metallic appearance and a high design property.

The plurality of to-be-decorated surfaces may be formed such that a predetermined direction becomes a height direction. In this case, the to-be-decorated area may include a step surface that connects the to-be-decorated surfaces having different heights.

With the step surface, radio wave permeability can be sufficiently secured.

The step surface may be a surface on which a metal layer is not formed or a surface on which a metal layer thinner than that formed on the to-be-decorated surfaces is formed.

By forming the step surface as a surface on which a metal layer is not formed or a surface on which a thin metal layer is formed, the radio wave permeability can be sufficiently secured.

The step surface may extend in the height direction.

Accordingly, the radio wave permeability can be sufficiently secured.

The plurality of to-be-decorated surfaces may include a first to-be-decorated surface having a first height, a second to-be-decorated surface having a second height different from the first height, and a third to-be-decorated surface having a third height different from both the first height and the second height.

By forming the to-be-decorated surfaces with at least 3 heights, the radio wave permeability can be sufficiently secured.

The plurality of to-be-decorated surfaces may be formed with heights with which, with a predetermined direction being a height direction, the to-be-decorated area becomes substantially the same plane when seeing the to-be-decorated area from the height direction.

Accordingly, since a metallic appearance is formed on substantially the same plane, a high design property can be exerted.

The plurality of to-be-decorated surfaces may be formed such that planar shapes thereof become substantially the same when seen from the height direction.

Accordingly, it becomes possible to suppress generation of unevenness in the metallic luster, for example, and also easily form the plurality of to-be-decorated surfaces.

The planar shapes may be any of a triangle, a rectangle, and a hexagon.

Accordingly, a high design property can be exerted, and the plurality of to-be-decorated surfaces can be formed easily.

The casing component may further include a base portion. In this case, the to-be-decorated area may be configured by connecting a film layer on which the plurality of to-be-decorated surfaces are formed to the base portion.

By using the film layer, a position of forming the to-be-decorated area and the like can be set easily.

The casing component may further include a base portion. In this case, the to-be-decorated area may be configured by forming the plurality of to-be-decorated surfaces in a predetermined area of the base portion.

The plurality of to-be-decorated surfaces may be directly formed on the base portion as described above. Accordingly, durability of the casing component can be improved.

According to an embodiment of the present technology, there is provided an electronic apparatus including a casing portion and an electronic component.

The casing portion includes the to-be-decorated area and the decoration portion.

The electronic component is accommodated in the casing portion.

Accordingly, it becomes possible to realize an electronic component having a metallic appearance and a high design property, the electronic component enabling communication using radio waves, for example.

The electronic component may include an antenna unit inside the to-be-decorated area.

Since the casing portion transmits radio waves, communication using the antenna unit can be executed appropriately.

According to an embodiment of the present technology, there is provided a casing component production method including forming a plurality of to-be-decorated surfaces to be decorated on a transfer film, the plurality of to-be-decorated surfaces being formed such that adjacent to-be-decorated surfaces have different heights.

A decoration portion including a metal layer is formed in each of the plurality of to-be-decorated surfaces formed on the transfer film.

A molding component is formed such that the plurality of to-be-decorated surfaces formed on the transfer film are transferred by an in-mold molding method.

By using the in-mold molding method, positions of forming the plurality of to-be-decorated surfaces and the like can be set easily.

According to another embodiment of the present technology, there is provided a casing component production method including forming a plurality of to-be-decorated surfaces to be decorated on an insert film, the plurality of to-be-decorated surfaces being formed such that adjacent to-be-decorated surfaces have different heights.

A decoration portion including a metal layer is formed in each of the plurality of to-be-decorated surfaces formed on the insert film.

A molding component is formed integrally with the insert film on which the plurality of to-be-decorated surfaces are formed by an insert molding method.

By using the insert molding method, positions of forming the plurality of to-be-decorated surfaces and the like can be set easily.

According to another embodiment of the present technology, there is provided a casing component production method including forming a plurality of to-be-decorated surfaces to be decorated on a base portion, the plurality of to-be-decorated surfaces being formed such that adjacent to-be-decorated surfaces have different heights.

A decoration portion including a metal layer is formed in each of the plurality of to-be-decorated surfaces formed on the base portion.

By directly forming the plurality of to-be-decorated surfaces on the base portion of the casing component, durability of the casing component can be improved.

Advantageous Effects of Invention

As described above, according to the present technology, it is possible to realize a casing component that has a high design property and is capable of transmitting radio waves while having a metallic appearance. It should be noted that the effects described herein are not necessarily limited, and any effect described in the present disclosure may be obtained.

MODE FOR CARRYING OUT THE INVENTION

Hereinafter, an embodiment of the present technology will be described with reference to the drawings.

[Configuration of Electronic Apparatus]

Figure 1A:
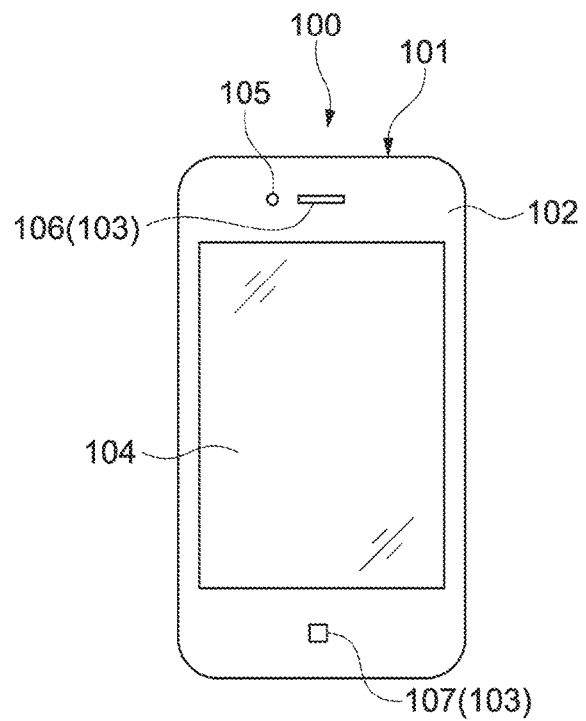
FIGS. 1A and 1B Schematic diagrams showing a configuration example of a mobile terminal according to an embodiment of the present technology.
Figure 1B:
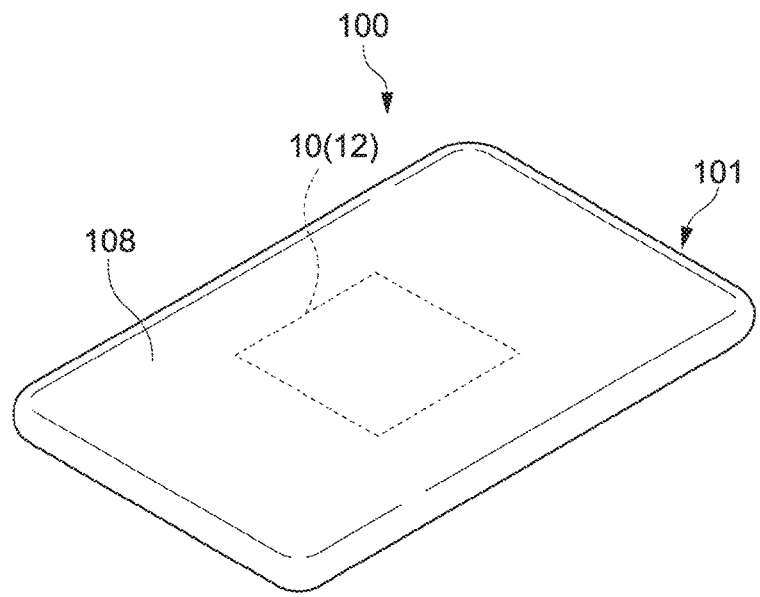

FIGS. 1A and 1B are schematic diagrams showing a configuration example of a mobile terminal as an electronic apparatus according to an embodiment of the present technology. FIG. 1A is a front view showing a front side of the mobile terminal 100, and FIG. 1B is a perspective view showing a back side of the mobile terminal 100.

The mobile terminal 100 includes a casing portion 101 and an electronic component (not shown) accommodated in the casing portion 101. As shown in FIG. 1A, a calling unit 103, a touch panel 104, and a self-photographing camera 105 are provided on a front surface portion 102 on a front side of the casing portion 101. The calling unit 103 is provided for talking on the phone and includes a speaker unit 106 and an audio input unit 107. Audio of an intended party is output from the speaker unit 106, and a voice of a user is transmitted to the intended party via the audio input unit 107. It should be noted that the casing portion 101 corresponds to the casing component of this embodiment.

Various images and GUIs (Graphical User Interfaces) are displayed on the touch panel 104. The user is capable of viewing still images and moving images via the touch panel 104. The user also inputs various touch operations via the touch panel 104. The self-photographing camera 105 is used when the user photographs his/her own face and the like. Specific configurations of the devices are not limited.

As shown in FIG. 1B, a metal decoration portion 10 decorated to have a metallic appearance is formed on a back surface portion 108 on a back side of the casing portion 101. The metal decoration portion 10 of this embodiment is capable of transmitting radio wave while having a metallic appearance.

Although the metal decoration portion 10 will be described later in detail, a to-be-decorated area 12 including a plurality of to-be-decorated surfaces 11 (see FIG. 2) is formed in a predetermined area of the back surface portion 108. The metal decoration portion 10 is realized by forming a decoration portion 14 including a metal layer 13 on each of the plurality of to-be-decorated surfaces 11. The to-be-decorated area 12 corresponds to an area where the metal decoration portion 10 is provided.

In the example shown in FIG. 1B, the metal decoration portion 10 (to-be-decorated area 12) is partially formed at substantially the center of the back surface portion 108. The position where the metal decoration portion 10 is formed is not limited and may be set as appropriate. Typically, the metal decoration portion 10 is formed according to a position where an antenna unit 15 (shown later) (see FIG. 2) is accommodated. It should be noted that the metal decoration portion 10 may be formed on the entire back surface portion 108. Accordingly, the entire back surface portion 108 can be made to have a uniform metallic appearance.

Even when the metal decoration portion 10 is formed on a part of the back surface portion 108 as shown in FIG. 1B, since other portions have substantially the same appearance as the metal decoration portion 10, the entire back surface portion 108 can be made to have a uniform metallic appearance. The configuration is of course not limited thereto, and it is also possible to improve a design property by forming portions other than the back surface portion 108 to have other appearances such as woodtone. The position and size of the metal decoration portion 10, appearances of other portions, and the like only need to be set as appropriate such that a design property that the user desires is exerted.

In this embodiment, the antenna unit 15 capable of communicating with an external reader/writer or the like using radio waves is accommodated as the electronic component accommodated in the casing portion 101. The antenna unit 15 includes, for example, a base substrate (not shown), an antenna coil 16 formed on the base substrate, a signal processing circuit unit (not shown) electrically connected to the antenna coil 16, and the like. A specific configuration of the antenna unit 15 is not limited. It should be noted that various electronic components such as an IC chip and a capacitor may also be accommodated as the electronic component accommodated in the casing portion 101.

Figure 2:
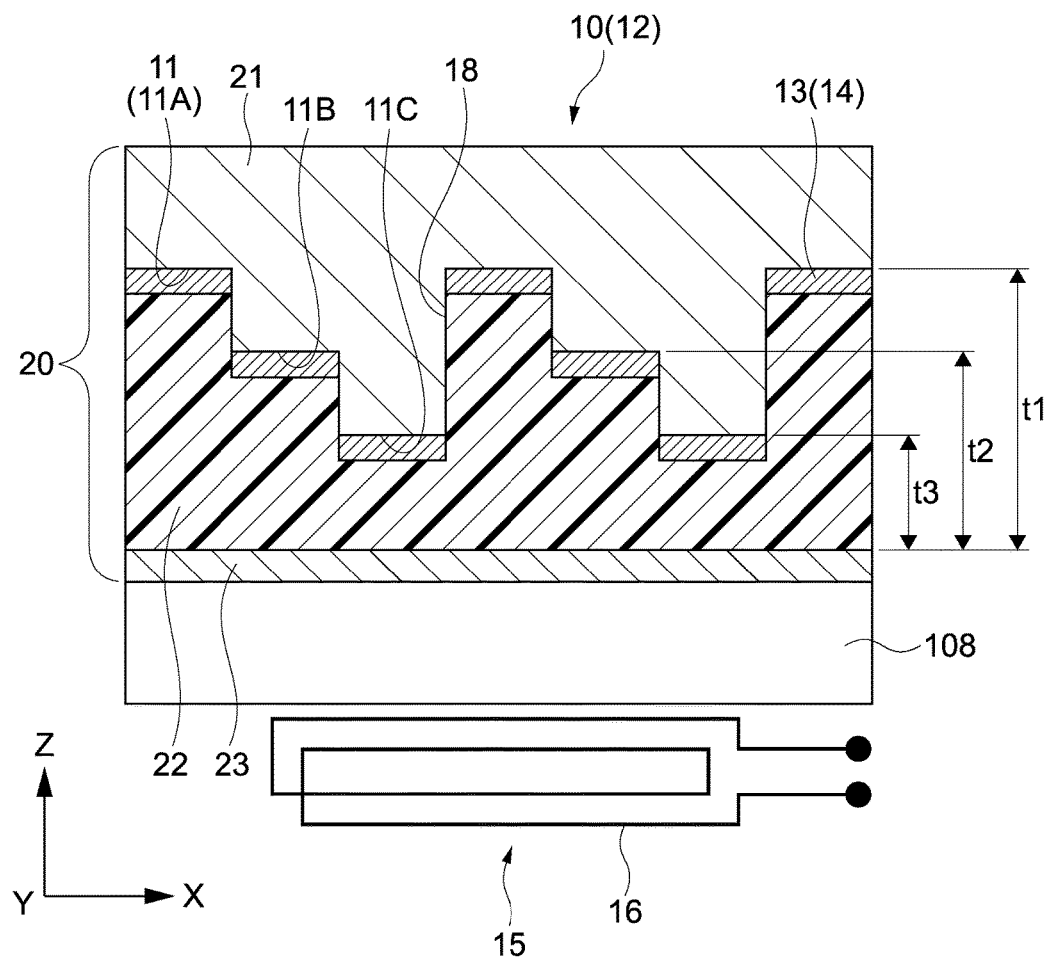
FIG. 2 A schematic diagram showing a configuration example of a metal decoration portion.

FIG. 2 is a schematic diagram showing a configuration example of the metal decoration portion 10. The metal decoration portion 10 includes the plurality of to-be-decorated surfaces 11 to be decorated and the decoration portion 14 including the metal layer 13 formed in each of the plurality of to-be-decorated surfaces 11. The plurality of to-be-decorated surfaces 11 are formed with a predetermined direction being a height direction. As shown in FIG. 2, in this embodiment, the plurality of to-be-decorated surfaces 11 are formed with a direction vertical to a plane direction (xy direction) of the back surface portion 108 accommodating the antenna unit 15 inside being the height direction.

Figure 3A:
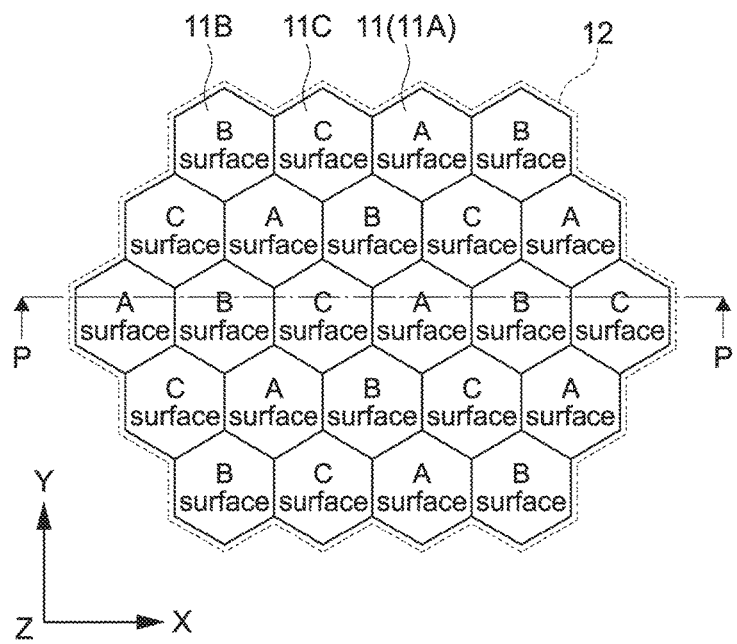
FIGS. 3A and 3B Schematic diagrams showing a configuration example of a plurality of to-be-decorated surfaces formed in a to-be-decorated area.
Figure 3B:
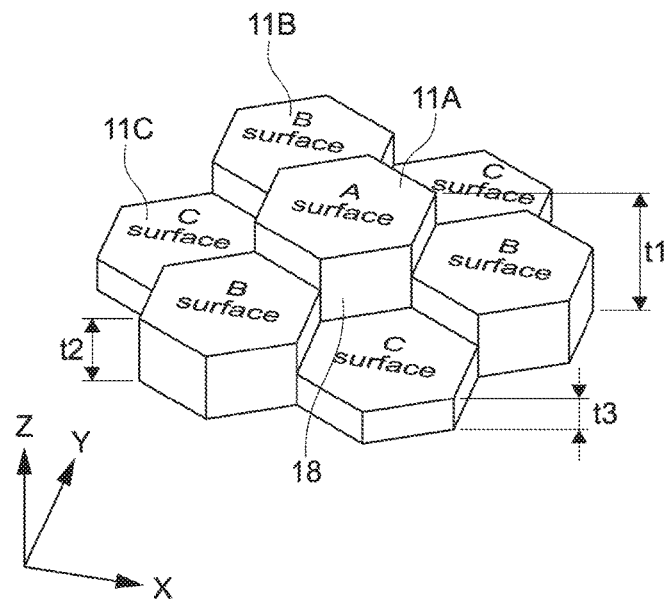

FIGS. 3A and 3B are schematic diagrams showing a configuration example of the plurality of to-be-decorated surfaces 11 formed in the to-be-decorated area 12. FIG. 3A is a plan view of the plurality of to-be-decorated surfaces 11 seen from a z direction. FIG. 3B is a schematic diagram showing a part of the plurality of to-be-decorated surfaces 11. It should be noted that the cross-sectional diagram of the metal decoration portion 10 shown in FIG. 2 corresponds to a part of the cross-sectional diagram taken along the line P-P in FIG. 3A.

As shown in FIGS. 3A and 3B, the plurality of to-be-decorated surfaces 11 are formed such that the adjacent to-be-decorated surfaces 11 have different heights. In this embodiment, the plurality of to-be-decorated surfaces 11 include a first to-be-decorated surface 11A (A surface) having a first height t1, a second to-be-decorated surface 11B (B surface) having a second height t2 different from the first height t1, and a third to-be-decorated surface 11C (C surface) having a third height t3 different from both the first height t1 and the second height t2. As shown in FIGS. 2 and 3B, the first height t1, the second height t2, and the third height t3 are set so as to become smaller in the stated order.

The heights t1, t2, and t3 of the to-be-decorated surfaces 11 are set as appropriate within the range from 0.01 μm to 100 μm, for example. Further, a difference among the heights of the to-be-decorated surfaces 11 (sizes of steps) also only need to be set as appropriate within the range from 0.01 μm to 100 μm, though not limited to this range. The heights with which the to-be-decorated surfaces 11 are formed are also not limited to the 3 stepwise heights. By forming the to-be-decorated surfaces 11 with at least 3 heights, radio wave permeability can be sufficiently secured.

The plurality of to-be-decorated surfaces 11 are typically formed with heights with which the to-be-decorated area 12 becomes substantially the same plane when seen from the z direction. Substantially the same plane includes both a substantially-same flat surface and a substantially-same curved surface. Accordingly, it becomes possible to configure a substantially-flat surface or a substantially-curved surface having a metallic appearance and thus exert a high design property. It should be noted that when the heights of the to-be-decorated surfaces 11 are set within the range from 0.01 μm to 100 μm as described above, the to-be-decorated area 12 becomes substantially the same plane, though of course not limited thereto.

As will be described later, in this embodiment, the casing portion 101 including the metal decoration portion 10 is formed by an in-mold molding method. At this time, the plurality of to-be-decorated surfaces 11 on each of which the decoration portion 14 is formed are transferred onto the casing portion 101. Therefore, as shown in FIG. 2, in this embodiment, the decoration portions 14 are formed on inner sides (casing portion 101 side) of the to-be-decorated surfaces 11 formed with predetermined heights. Of course, the configuration is not limited thereto, and a configuration in which the decoration portions 14 are formed on outer sides of the to-be-decorated surfaces 11 may be adopted instead.

Further, the casing portion 101 may be formed integrally with an insert film on which the plurality of to-be-decorated surfaces 11 are formed by an insert molding method, for example, the decoration portion 14 being formed in each of the to-be-decorated surfaces 11. Also in this case, the decoration portions 14 may be formed either on the inner side or outer side of the to-be-decorated surfaces 11. The direction is typically determined based on an insertion direction of the insert film.

As shown in FIGS. 2 and 3B, the to-be-decorated surfaces 11 having different heights are connected to one another by step surfaces 18 extending in the z direction. Therefore, in this embodiment, the to-be-decorated area 12 includes the step surfaces 18. As shown in FIGS. 2 and 3B, the step surfaces 18 are each a surface that is not a target for forming a metal layer, that is, a surface on which a metal layer is not formed, though not limited thereto. A metal layer thinner than the metal layer 13 formed in each of the to-be-decorated surfaces 11 may be formed in the step surfaces 18. The thickness of the metal layer may be set as appropriate within the range in which the metal decoration portion 10 is capable of transmitting radio waves. By forming the metal layer in the step surfaces 18 extending in the z direction, a design property can be improved.

It should be noted that a surface on which a metal layer is not formed and a surface on which a metal layer is formed may coexist as the plurality of step surfaces 18 extending in the z direction.

It should be noted that the step surfaces 18 are not limited to the case of extending in the height direction. For example, the step surfaces 18 may be formed obliquely so as to overhang. Also in this case, the radio wave permeability can be sufficiently secured.

As shown in FIG. 3A, the plurality of to-be-decorated surfaces 11 are formed such that planar shapes thereof seen from the height direction become substantially the same. In this embodiment, the planar shapes of the to-be-decorated surfaces 11 are a regular hexagon, thus configuring a so-called honeycomb pattern. Also in this embodiment, the plurality of to-be-decorated surfaces 11 cover the entire to-be-decorated area 12 when the to-be-decorated area 12 is seen from the height direction.

Therefore, the entire to-be-decorated area 12 can be made to have a uniform metallic appearance. Also by forming the to-be-decorated surfaces 11 having the same planar shape, it also becomes possible to suppress generation of unevenness in metallic luster, easily form the plurality of to-be-decorated surfaces 11 without undergoing complicated processes, and suppress costs, for example. Of course, the shape is not limited to a regular hexagon, and other hexagons may be adopted instead.

It should be noted that in FIG. 3A, the to-be-decorated surfaces 11 having different heights are illustrated distinctively. However, when the decoration portion 14 including the metal layer 13 is formed in each of the to-be-decorated surfaces 11, a uniform metallic appearance of the to-be-decorated surfaces 11 can be obtained regardless of the heights.

The sizes of the to-be-decorated surfaces 11 are set within the range from 0.01 μm² to 100 μm², for example, though not limited to this range. The heights and sizes of the to-be-decorated surfaces 11 may be set as appropriate based on a frequency of radio waves to be transmitted, an intensity, and a design property in terms of an appearance.

As described above, in this embodiment, the adjacent to-be-decorated surfaces 11 are formed to have different heights in the to-be-decorated area 12. Therefore, since the to-be-decorated surfaces 11 are configured to be independent from one another, a discontinuous surface is formed. Accordingly, it becomes possible to sufficiently suppress generation of an eddy current when radio waves come into contact with the casing portion 101 and sufficiently suppress lowering of an electromagnetic energy due to an eddy-current loss.

As a result, even when the to-be-decorated surfaces 11 are in contact with one another, that is, even when the entire to-be-decorated area 12 is covered by the plurality of to-be-decorated surfaces 11 as shown in FIG. 3A, for example, radio waves can be sufficiently transmitted. Moreover, by the step surfaces 18 extending in the height direction, the radio wave permeability can be sufficiently secured. As a result, it becomes possible to realize a casing portion 101 that has a high design property and is capable of transmitting radio waves while having a metallic appearance.

An example of forming the metal decoration portion 11 will be described. As shown in FIG. 2, in this embodiment, the to-be-decorated area 12 is formed by connecting a radio wave transmission film 20 (corresponding to film layer; hereinafter, referred to as film 20) on which the plurality of to-be-decorated surfaces 11 are formed to the back surface portion 108 corresponding to the base portion.

As a production example of the film 20, a transparent substrate 21 that is formed of a transparent resin material and on which a concavo-convex shape is transferred using a fine concavo-convex mold, for example, is formed. The concavo-convex shape to be transferred is a shape designed as appropriate for forming the first to third to-be-decorated surfaces 11A to 11B. As the transparent resin material, an arbitrary material such as a thermoset resin and a UV-curable resin may be used. It should be noted that the transparent substrate 21 including the concavo-convex shape may be formed by other methods such as optical modeling.

Figure 4:
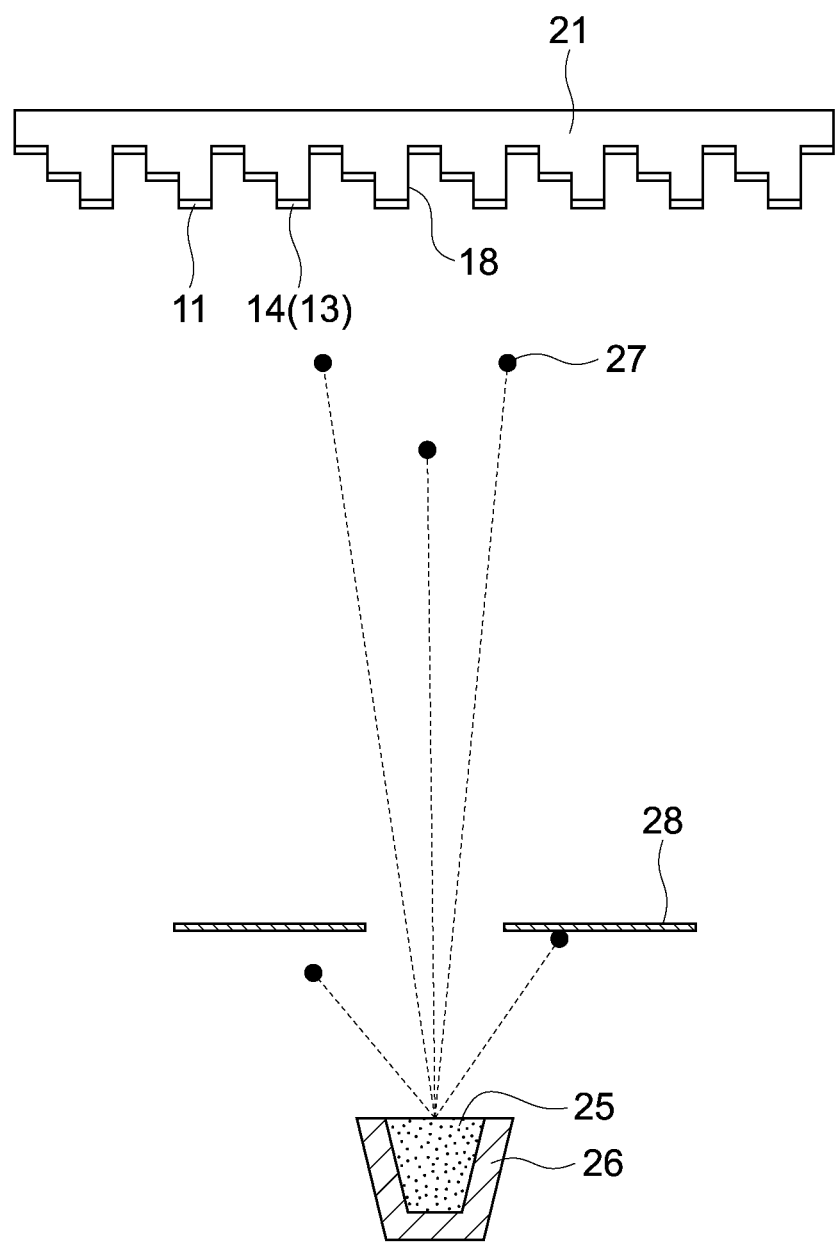
FIG. 4 A diagram schematically showing deposition by vacuum vapor deposition as a method of forming the decoration portion.

FIG. 4 is a diagram schematically showing deposition by vacuum vapor deposition as a method of forming the decoration portions 14 in the plurality of to-be-decorated surfaces 21. For example, the transparent substrate 21 is fixed inside a vacuum chamber (not shown) such that the to-be-decorated surfaces 11 (concavo-convex surface) face downward. A crucible 26 accommodating a metal material 25 is provided at a position opposed to the transparent substrate 21.

The metal material 25 in the crucible 26 is heated by a heat source (not shown) such as a heater, a laser, and an electron gun. Accordingly, vapors 27 of the metal material 25 are generated from the crucible 26. When performing vapor deposition in a high vacuum state, for example, angles of the vapors 27 of the metal material 25 generated from the crucible 26 are restricted by incident angle restriction plates 28 so that the vapors 27 proceed substantially straight without colliding with other molecules. Accordingly, the metal layer 13 is deposited on the to-be-decorated surfaces 11 of the transparent substrate 21. On the other hand, deposition is not performed on the step surfaces 18.

For example, when a vacuum degree during deposition is $5*10^{-3}$ Pa, a mean free process (distance before colliding with other molecules) becomes about 1.3 m. Therefore, particles proceed straight to the transparent substrate 21 from the crucible 26. For example, by parting the crucible 26 and the transparent substrate 21 within the range of about 200 mm to 500 mm and providing the incident angle restriction plates 28 in the middle, the metal material 25 can be deposited on the to-be-decorated surfaces 11 as horizontal portions.

As the metal material 25, metal having high reflectance with respect to visible light and relatively low magnetic permeability (e.g., Al, Ti, Cr, Fe alloy, Co, Ni, Cu, Zn, Ag, W, Ir, Au, Pt, or alloy including those) or the like is used, for example. Of course, the material is not limited thereto, and other metal materials may be used instead. For example, the metal material 25 is selected as appropriate considering a design property, material costs, and the like. The thickness of the metal layer 13 is also not limited but is deposited in a thickness with which visible light is substantially reflected (e.g., several nm to 100 nm), for example.

A configuration or the like of an apparatus for performing vacuum vapor deposition is not limited, and a well-known technology may be used as appropriate. Further, other deposition technologies different from vacuum vapor deposition, such as sputtering, may also be used.

After the decoration portions 14 are formed by the vapor deposition as shown in FIG. 2, a UV-curable resin, a thermoset resin, a 2-liquid curable resin, or the like is applied so as to cover the decoration portions 14. As a result, a sealing resin 22 is formed. Accordingly, a surface to be attached to the back surface portion 108 is smoothened. As the smoothening is completed, an adhesive layer 23 is formed by being applied to a side of the sealing resin 22 to be adhered onto the back surface portion 108. Specific configurations of the sealing resin 22 and the adhesive layer 23 are not limited, and these may be omitted depending on molding conditions and the like.

Figure 5B:
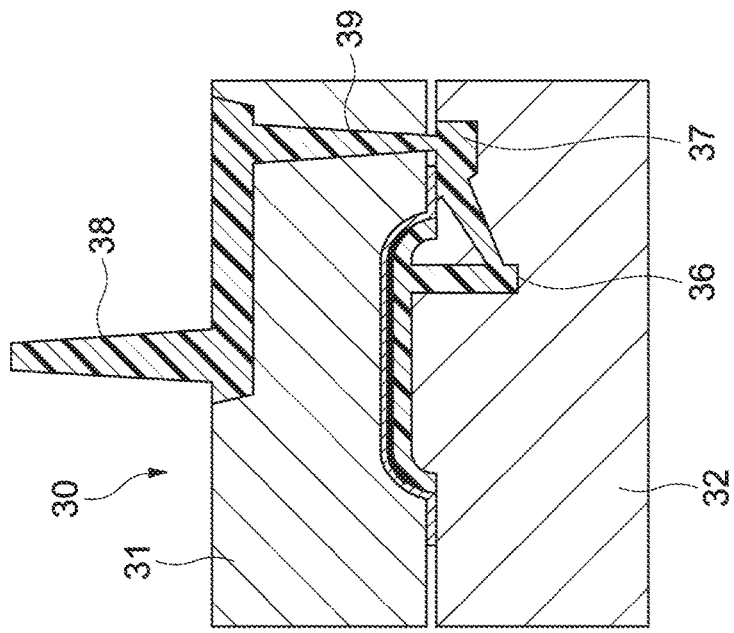
FIGS. 5A and 5B Schematic diagrams for explaining an in-mold molding method.
Figure 5A:
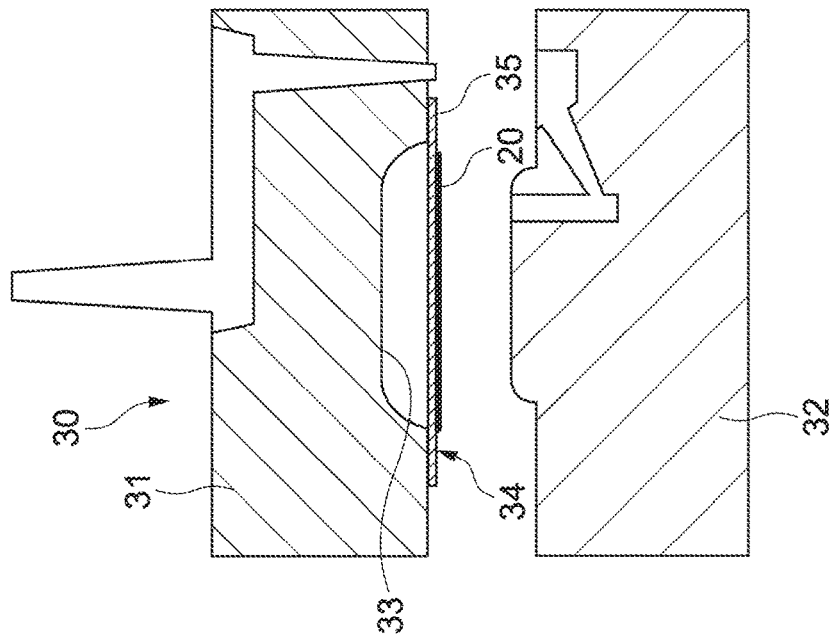

FIGS. 5A and 5B are schematic diagrams for explaining an in-mold molding method. The in-mold molding is performed by a molding apparatus 30 including a cavity mold 31 an a core mold 32 as those shown in FIGS. 5A and B. As shown in FIG. 5A, a concave portion 33 corresponding to the shape of the casing portion 101 is formed in the cavity mold 31. A transfer film 34 is arranged so as to cover the concave portion 33. The transfer film 34 is obtained by laminating the film 20 shown in FIG. 2 on a carrier film 35. The transfer film 34 is supplied from outside the molding apparatus 30 by a roll-to-roll system, for example.

As shown in FIG. 5B, the cavity mold 31 and the core mold 32 are clamped, and a molding resin 37 is injected into the concave portion 33 via a gate portion 36 formed in the core mold 32. A sprue portion 38 through which the molding resin 37 is supplied and a runner portion 39 coupled to the sprue portion 38 are formed in the cavity mold 31. After the cavity mold 31 and the core mold 32 are clamped, the runner portion 39 and the gate portion 36 are coupled to each other. Accordingly, the molding resin 37 supplied to the sprue portion 38 is injected into the concave portion 33. It should be noted that the configurations of the gate portion 36 and the sprue portion 38 for injecting the molding resin 37 are not limited.

Examples of the molding resin 37 include a general-purpose resin such as an ABS (acrylonitrile-butadiene-styrene) resin and engineering plastic such as a PC (polycarbonate) resin and a mixed resin of ABS and PC, though not limited thereto. The material and color (transparency) of the molding resin may be selected as appropriate so that a desired casing portion (casing component) can be obtained.

The molding resin 37 is injected into the concave portion 33 in a state where it is melted at high temperature. The molding resin 37 is injected so as to press an inner surface of the concave portion 33. At this time, the transfer film 34 arranged on the concave portion 33 is deformed by being pressed by the molding resin 37. The adhesive layer 23 formed on the transfer film 34 is melted by the heat of the molding resin 37, and the film 20 is thus connected to the front surface of the molding resin 37.

After the molding resin 37 is injected, the cavity mold 31 and the core mold 32 are cooled, and the clamp is released. The molding resin 37 onto which the plurality of to-be-decorated surfaces 11 are transferred is adhered onto the core mold 32. By taking out the molding resin 37, a casing portion 101 in which the metal decoration portion 10 is formed in a predetermined area is produced. It should be noted that the carrier film 35 is peeled off when releasing the clamp.

By using the in-mold molding method, the position of forming the to-be-decorated area 11 and the like can be set easily. Moreover, the metal decoration portion 10 can be formed easily regardless of the shape of the casing portion 101 to be molded.

It should be noted that the antenna unit 15 to be accommodated in the casing portion 101 may be attached by the in-mold molding method during molding of the casing portion 101. Alternatively, the antenna unit 15 may be attached inside the casing portion 101 after the casing portion 101 is molded. Alternatively, the antenna unit 15 may be incorporated into the casing.

As shown in FIG. 2, in this embodiment, the film 20 is connected to the casing portion 101 such that the transparent substrate 21 on which the plurality of to-be-decorated surfaces 11 are formed opposes the casing portion 101. However, the configuration is not limited thereto, and a surface of the transparent substrate 21 on the other side of the side on which the plurality of to-be-decorated surfaces 11 are formed may be connected to the casing portion 101. In other words, the transparent substrate 21 may be arranged on the sealing resin 22 side shown in FIG. 2.

In this case, the decoration portions 14 are formed on the outer side of the to-be-decorated surfaces 11. Also in this case, an opaque material may be used for forming a substrate including the plurality of to-be-decorated surfaces 11. Further, a transparent material only needs to be used when forming a protection portion to cover the decoration portions 14. It should be noted that in the configuration shown in FIG. 2, it is also possible to cause the transparent substrate 21 to function as the protection portion that protects the decoration portions 14.

The casing portion according to the present technology may also be formed by an insert molding method. Specifically, the plurality of to-be-decorated surfaces to be decorated are formed on an insert film such that adjacent to-be-decorated surfaces out of the plurality of to-be-decorated surfaces have different heights. Then, a decoration portion including a metal layer is formed on each of the plurality of to-be-decorated surfaces formed on the insert film. The casing portion is formed integrally with the insert film on which the plurality of to-be-decorated surfaces are formed so that the metal decoration portion is formed at a predetermined position. Also by using the insert molding method, the position of forming the to-be-decorated area and the like can be set easily. Moreover, the metal decoration portion can be formed easily regardless of the shape of the casing portion to be molded.

Figure 6:
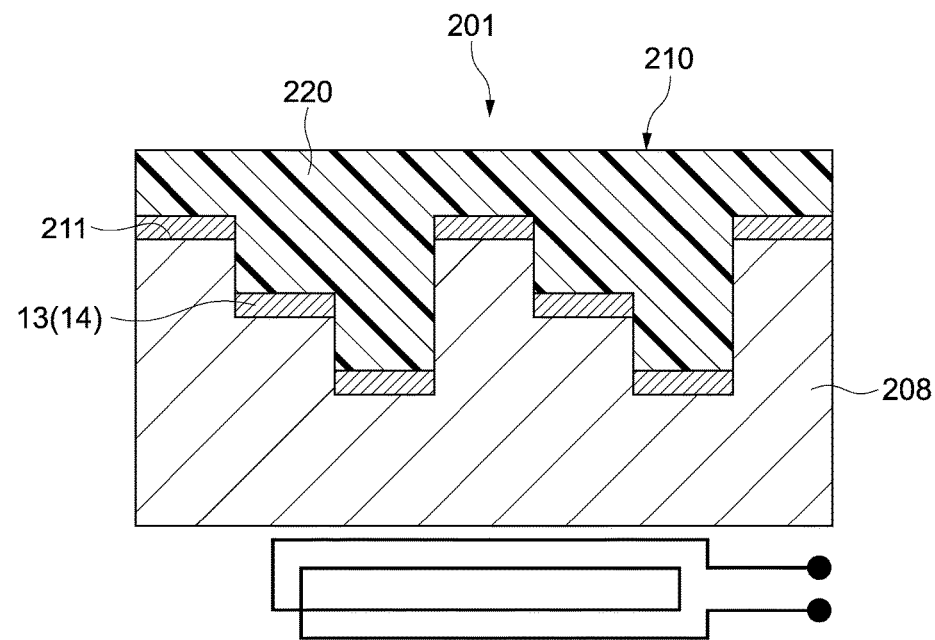
FIG. 6 A schematic diagram showing another configuration example of the casing portion including the metal decoration portion.

FIG. 6 is a schematic diagram showing another configuration example of a casing portion including the metal decoration portion 10. In a casing portion 201, a plurality of to-be-decorated surfaces 211 are directly formed in a predetermined area of a back surface portion 208 as a base portion. For example, the casing portion 201 including the plurality of to-be-decorated surfaces 211 can be formed by injection molding using a fine concavo-convex mold. The decoration portion 14 including the metal layer 13 is formed in each of the plurality of to-be-decorated surfaces 211 formed in the casing portion 201 by vacuum vapor deposition shown in FIG. 4 or the like. As a result, a metal decoration portion 210 is formed. It should be noted that a transparent protection film 220 that covers the decoration portions 14 may be formed by being applied, being injected again, or the like.

By forming the protection film 220, effects of smoothening, antifouling, antistripping, anti-scratch, and the like can be exerted.

The casing portion 201 in which the plurality of to-be-decorated surfaces 211 are directly formed may be produced by forming the fine concavo-convex shape by optical modeling or using a 3D printer. Alternatively, the casing portion 201 may be produced by an imprint method or the like. By directly forming the plurality of to-be-decorated surfaces 211 in the casing portion 201, durability of the casing portion 201 can be improved.

Figure 7:
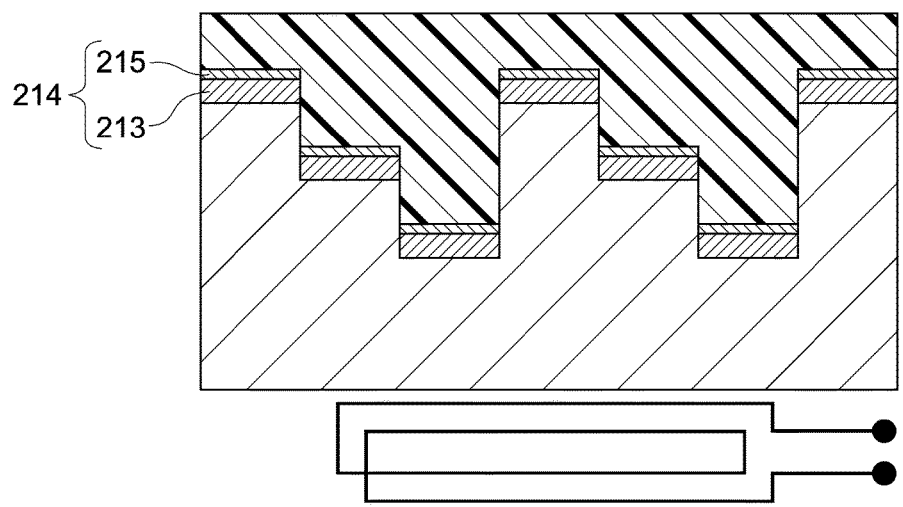
FIG. 7 A schematic diagram showing another configuration example of the decoration portion including a metal layer.

FIG. 7 is a schematic diagram showing another configuration example of decoration portions each including a metal layer. The decoration portions 214 shown in FIG. 7 each include a metal layer 213 and a reflection enhancing film 215 formed on the metal layer 213. A thin film formed of a predetermined dielectric body, for example, is used as the reflection enhancing film 215. The thickness of the reflection enhancing film 215 is represented by d, and a refractive index of the dielectric body used as the reflection enhancing film 215 is represented by n. The thickness d is set so as to satisfy $2nd=\lambda$ ($\lambda$ represents visible light wavelength). With this configuration, optical reflectance increases since light reflected by a front surface of the reflection enhancing film 215 and light reflected by the metal layer 213 reinforce each other. As a result, it becomes possible to improve a design property and decoration property. It should be noted that the specific configuration of the reflection enhancing film 215 is not limited.

As described above, members different from the metal layer 213, such as the reflection enhancing film 215, may be used as the decoration portions 214. This technology is also applicable to a case where the film 20 on which the plurality of to-be-decorated surfaces 11 are formed is used.

Figures 8A, 8B:
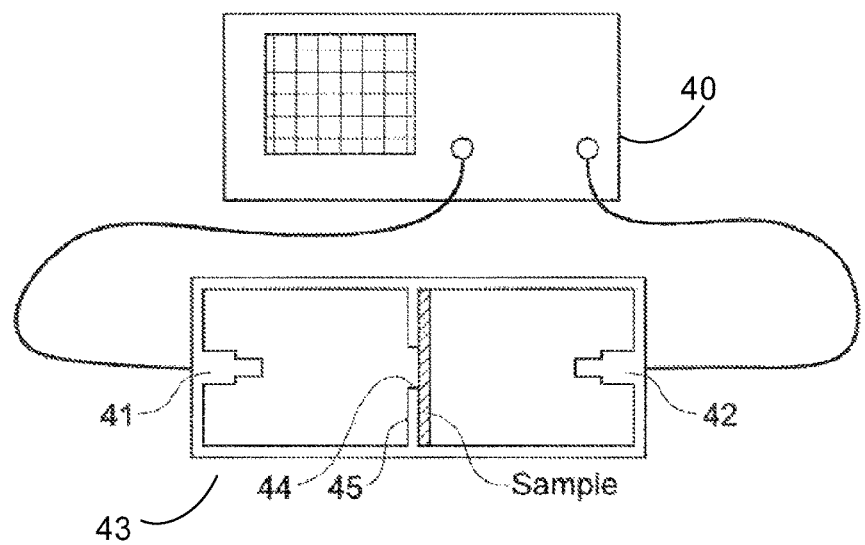
FIGS. 8A and 8B Schematic diagrams for explaining evaluation of radio wave permeability.
Figure 9A:
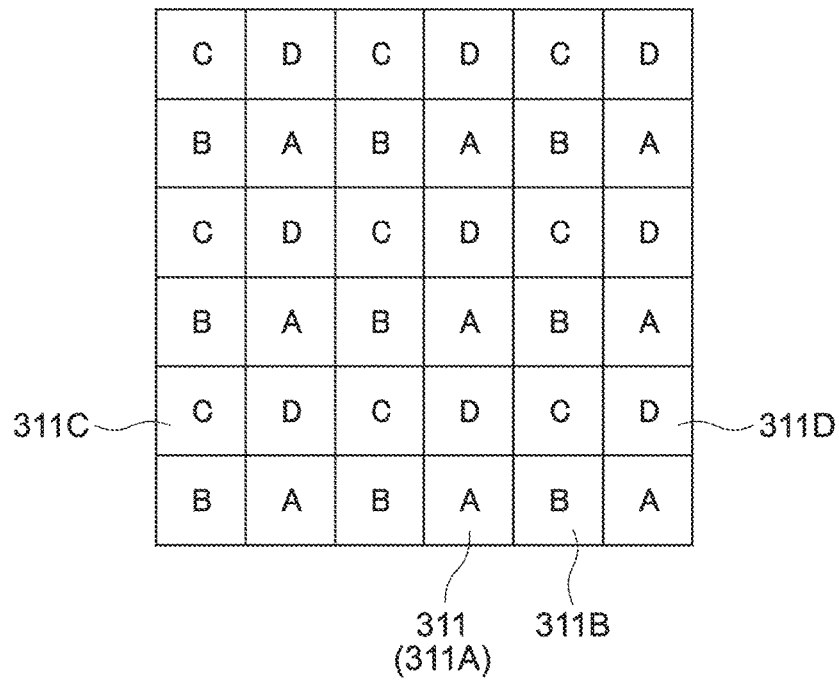
FIGS. 9A and 9B Schematic diagrams showing another configuration example of the plurality of to-be-decorated surfaces formed in the to-be-decorated area.
Figure 9B:
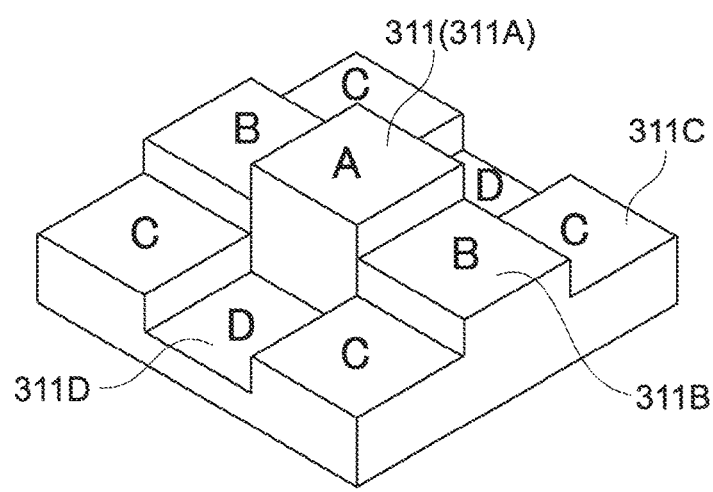

A metal decoration property and radio wave permeability in a case where the metal decoration portion according to the present technology is formed will be described. FIG. 8A is a schematic diagram for explaining a radio wave permeability evaluation method. FIG. 8B is a table showing a result of the radio wave permeability evaluation.

Films each including the metal decoration portion according to the present technology were created as two types of samples used in the evaluation, that is, samples A and B. The samples A and B each include a configuration that is substantially the same as that shown in FIGS. 2 and 3. The planar shapes of to-be-decorated surfaces formed on the samples A and B are each a regular hexagon, and a two-surface width (distance between two surfaces opposing each other) is about 100 μm. In the sample A, the size of steps among the to-be-decorated surfaces is about 50 μm. In the sample B, the size of steps among the to-be-decorated surfaces is about 30 μm. The size of steps among the to-be-decorated surfaces refers to a distance between the first and second to-be-decorated surfaces 11A and 11B (t1-t2) and a distance between the second and third to-be-decorated surfaces 11B and 11C (t2-t3) in the example shown in FIG. 2.

A substrate formed of an acrylic resin was created so that the plurality of to-be-decorated surfaces as described above are formed, and Al was deposited on each of the to-be-decorated surfaces in a thickness of 23 nm at a velocity of 1 nm/s by EB vapor deposition (electron beam vapor deposition) in a vacuum degree of about $6.0*10^{-3}$ Pa. At this time, a distance between a crucible and the substrate was about 500 nm, and a substrate rotation or the like was not performed. As a result of observing the metal decoration portion from the height direction after completing the deposition, the appearance became close to aluminum metal that has been subjected to hairline processing or sandblast processing, and a high design property with which light can be reflected at high reflectance was confirmed.

As shown in FIG. 8A, a network analyzer (high frequency circuit) 40 was used for the radio wave permeability evaluation. A reflection power terminal 41 and passing power terminal 42 of the network analyzer 40 are respectively set at both ends of a waveguide 43 having a diameter of 100 mm and a length of 260 mm. Provided at a center portion of the waveguide 43 is an aperture 45 in which an angular hole 44 having an opening of 40 mm*40 mm is formed. The samples A and B described above, samples as comparison targets (aluminum foil and aluminum plate), and a reference sample (indium foil having radio wave permeability) were each held in the aperture 45 to thus evaluate the radio wave permeability based on peak values measured by the passing power terminal 42.

As shown in FIG. 8B, when a sample is not set in the aperture 45, an attenuation becomes 0 dB. Using the measurement value obtained at this time as a reference value, the attenuation of the indium foil having radio wave permeability becomes −1.6 dB. It should be noted that the indium foil having radio wave permeability is obtained by forming a discontinuous film formed of indium using a poor wetting property of indium.

The aluminum foil and aluminum plate as the comparison target samples each had an attenuation of −26 dB, and it can be seen that the radio wave permeability is extremely poor.

The samples A and B in each of which the metal decoration portion according to the present technology is formed had attenuations of −1.5 dB and −1.4 dB, respectively, which are equal to or lower than that of the indium foil having radio wave permeability. In other words, it was proven that the samples A and B according to the present technology exert excellent radio wave permeability equal to or higher than that of the indium foil having radio wave permeability.

FIGS. 9 to 12 are schematic diagrams showing other configuration examples of the plurality of to-be-decorated surfaces formed in the to-be-decorated area. In the example shown in FIGS. 9A and 9B, a plurality of to-be-decorated surfaces 311 having the same planar shape which is a square are formed. The plurality of to-be-decorated surfaces 311 are formed such that adjacent to-be-decorated surfaces 311 have different heights and include the following first to fourth to-be-decorated surfaces 311A to 311D. Of course, the square includes various squares such as a regular tetragon and a rectangle.

First to-be-decorated surfaces 311A having first height (A surface)

Second to-be-decorated surfaces 311B having second height (B surface)

Third to-be-decorated surfaces 311C having third height (C surface)

Fourth to-be-decorated surfaces 311D having fourth height (D surface)

It should be noted that the first to fourth heights are set to decrease in the stated order, though not limited thereto.

It should be noted that the adjacent to-be-decorated surfaces include both cases where the surfaces are adjacent to one another via side portions and the surfaces are adjacent to one another via corner portions (apex portions).

Figure 10:
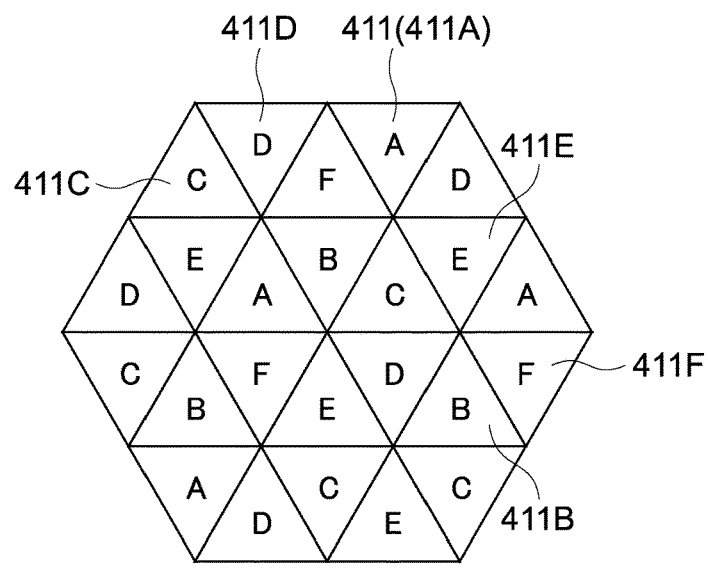
FIG. 10 A schematic diagram showing another configuration example of the plurality of to-be-decorated surfaces formed in the to-be-decorated area.

In the example shown in FIG. 10, a plurality of to-be-decorated surfaces 411 having the same planar shape which is a triangle are formed. The plurality of to-be-decorated surfaces 411 include first to sixth to-be-decorated surfaces 411A to 411F (A to F surfaces) having different heights. The first to sixth to-be-decorated surfaces 411A to 411F respectively have first to sixth heights. Of course, the triangle includes various triangles such as a regular triangle and an isosceles triangle.

Figure 11:
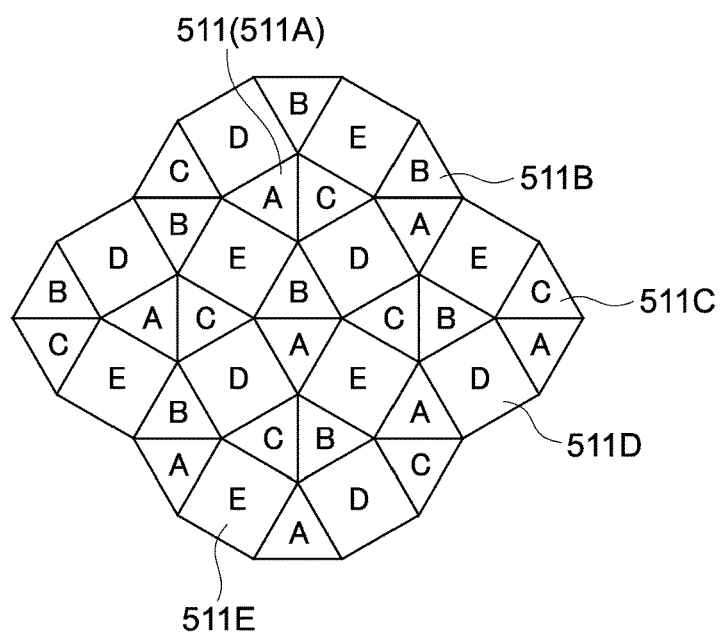
FIG. 11 A schematic diagram showing another configuration example of the plurality of to-be-decorated surfaces formed in the to-be-decorated area.

In the example shown in FIG. 11, a plurality of to-be-decorated surfaces 511 including first to third to-be-decorated surfaces 511A to 511C (A to C surfaces) having a triangular planar shape and fourth and fifth to-be-decorated surfaces 511D to 511E (D and E surfaces) having a square planar shape are formed. The first to fifth to-be-decorated surfaces 511A to 511E are formed to have different heights (respectively having first to fifth heights). The plurality of to-be-decorated surfaces 511 may be formed such that the to-be-decorated surfaces 511 having different planar shapes coexist as described above.

Figure 12:
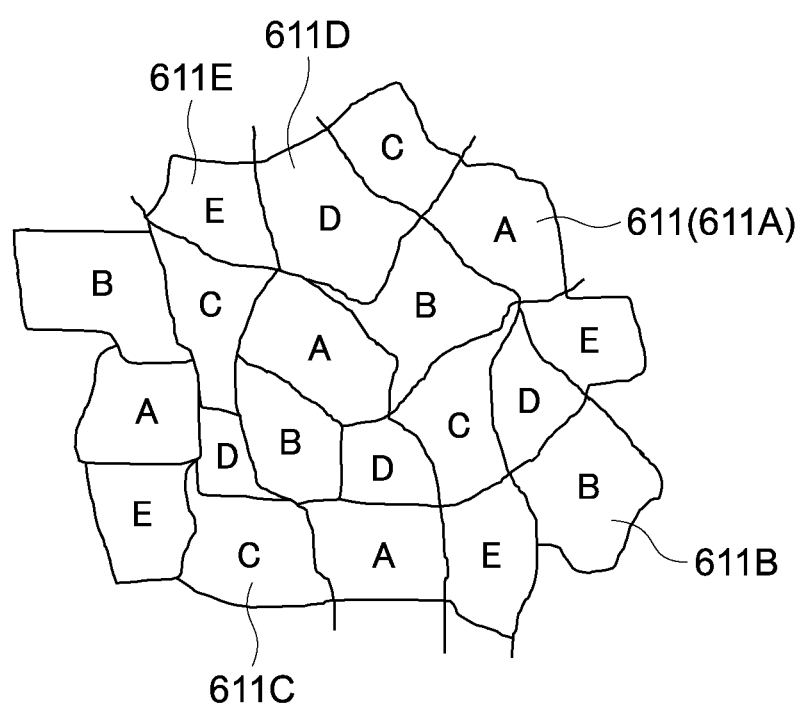
FIG. 12 A schematic diagram showing another configuration example of the plurality of to-be-decorated surfaces formed in the to-be-decorated area.

In the example shown in FIG. 12, a plurality of to-be-decorated surfaces 611 having indefinite planar shapes are formed such that the adjacent to-be-decorated surfaces 611 have different heights. In the example shown in FIG. 12, first to fifth to-be-decorated surfaces 611A to 611E (corresponding to A to E surfaces) respectively having first to fifth heights are formed. Since the planar shapes of the to-be-decorated surfaces 611 are indefinite and different from one another, even the same first to-be-decorated surfaces 611A have different planar shapes, for example.

As described above, as long as the adjacent to-be-decorated surfaces are formed to have different heights, the planar shapes of the to-be-decorated surfaces may be arbitrary shapes. Even when the to-be-decorated surfaces having polygonal planar shapes as described above are formed, for example, the planar shapes of the to-be-decorated surfaces may lose their shapes depending on the accuracy of a mold to be created by cutting processing, laser processing, or electric spark machining. In other words, the corner portions of the to-be-decorated surfaces may be rounded, or processing marks may be caused. Even when accurate polygonal shapes are not formed as described above, the effects of the present technology are sufficiently exerted.

In the indium foil having radio wave permeability described above, radio wave permeability is realized by the discontinuous film formed of indium. However, since such an indium foil is thin, sufficient reflectance cannot be obtained and the foil darkens, with the result that the design property of the metal decoration portion becomes extremely low. In addition, since indium is rare metal, material costs increase.

It is also possible to use a method of forming a discontinuous film by applying a stress to a metal plate film to cause fine cracks. For realizing this method, however, a top coat needs to be applied for antistripping after plating of metal, with the result that costs increase. There is also a fear that, since the plate is applied with a stress, a residual stress remains between the substrate and the plate film to cause peeling of the film. Especially in mobile products and the like, the top coat is worn off in many cases by abrasion caused when being carried, and thus there is a fear that plating will be peeled off to result in a danger that a sharp portion will be exposed.

In contrast, with the casing portion including the metal decoration portion according to the present technology, effects as follows can be exerted.

The radio wave permeability can be improved while improving an additional value in terms of design by metal decoration.

Since most of the metal can be used as the decoration portion by vapor deposition or the like, a range of selectivity of textures is wide.

Since luster and reflectance can be improved as compared to products used from the past, high additional values can be realized.

Since the casing portion can be formed by processes capable of realizing mass production, mass production and cost reduction can be realized.

Since the casing portion can be formed without performing a masking process or an etching process, cost reduction can be realized, and toxic waste can be prevented from being generated.

Since the protection portion that protects the decoration portions can be easily formed at the outermost portion (e.g., transparent substrate 21 shown in FIG. 2 or protection film 220 shown in FIG. 6), it is possible to prevent defects such as peeling of the decoration portions and also prevent the decoration portions from being worn out due to usage over time. As a result, a quality of appearance can be maintained. In addition, by coloring the protection portion, a new design expression of metal+coloring can be realized.

Since the casing portion formed of a resin can be formed easily, lightweight products can be realized.

The present technology is applicable to almost all electronic apparatuses including a built-in antenna or the like. Examples of the electronic apparatuses include an electronic apparatus such as a cellular phone, a smartphone, a personal computer, a game device, a digital camera, an audio apparatus, a TV, a projector, a car navigation system, a GPS terminal, a digital camera, and a wearable information apparatus (glasses type, wristband type), an operation apparatus such as a remote controller for operating those via wireless communication and the like, a mouse, and a touch pen, and an electronic apparatus equipped in a vehicle, such as an in-car radar and an in-car antenna.

Textures can be changed to desired textures by changing the concavo-convex shape, sizes, and the like of the plurality of to-be-decorated surfaces.

By setting the materials, thicknesses, and the like of the concavo-convex shape, the reflection enhancing film, the protection portion, and the like as appropriate, a configuration in which shades, textures, and the like vary depending on an angle at which the casing portion is viewed can be realized, and an extremely high design property can be exerted.

It should be noted that the effects described in the present disclosure, that include the effects listed herein, are mere examples and are not limited thereto. Further, the descriptions above on the plurality of effects do not mean that the effects are always exerted at the same time. The descriptions mean that at least one of the effects described above is obtained depending on the conditions and the like, and effects not described in the present disclosure may of course also be obtained.

Other Embodiments

The present technology is not limited to the embodiment above, and various other embodiments can also be realized.

Figure 13A:
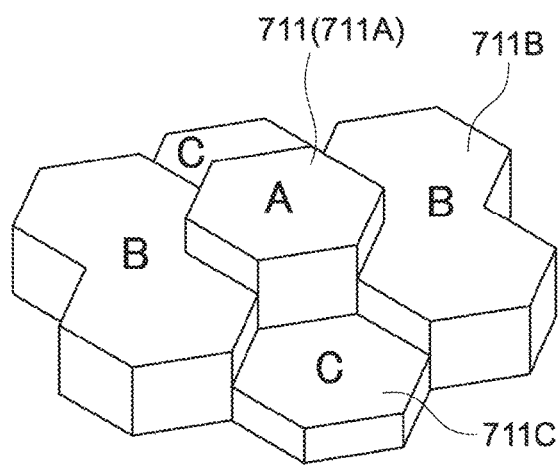
FIGS. 13A and 13B Schematic diagrams showing another configuration example of the plurality of to-be-decorated surfaces.
Figure 13B:
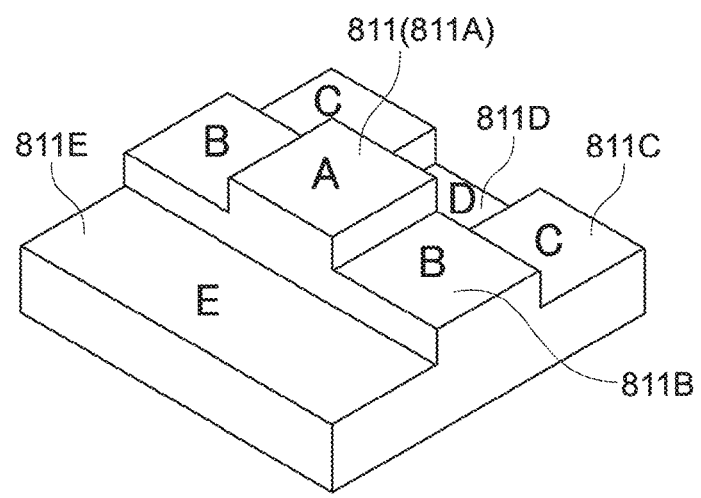

FIGS. 13A and 13B are schematic diagrams showing another configuration example of the plurality of to-be-decorated surfaces. In the example shown in FIG. 13A, first and second to-be-decorated surfaces 711A and 711C (A and C surfaces) whose planar shapes are a regular hexagon and third to-be-decorated surfaces 711B (B surfaces) having a shape in which the first and second to-be-decorated surfaces 711A and 711C are coupled are formed. The first to third to-be-decorated surfaces 711A to 711B are formed to have different heights. As long as the adjacent to-be-decorated surfaces 711 have different heights, the configuration as that shown in FIG. 13A may be adopted.

In the example shown in FIG. 13B, first to fourth to-be-decorated surfaces 811A to 811D (A to D surfaces) whose planar shapes are a regular tetragon and a fifth to-be-decorated surface 811E (E surface) having a shape in which three of the first to fourth to-be-decorated surfaces 811A to 811D are coupled in one direction are formed. The first to fourth to-be-decorated surfaces 811A to 811D are formed to have different heights, and the fifth to-be-decorated surface 811E is formed to have the same height as the third to-be-decorated surface 811C. Such a configuration may also be adopted, for example.

Figure 14:
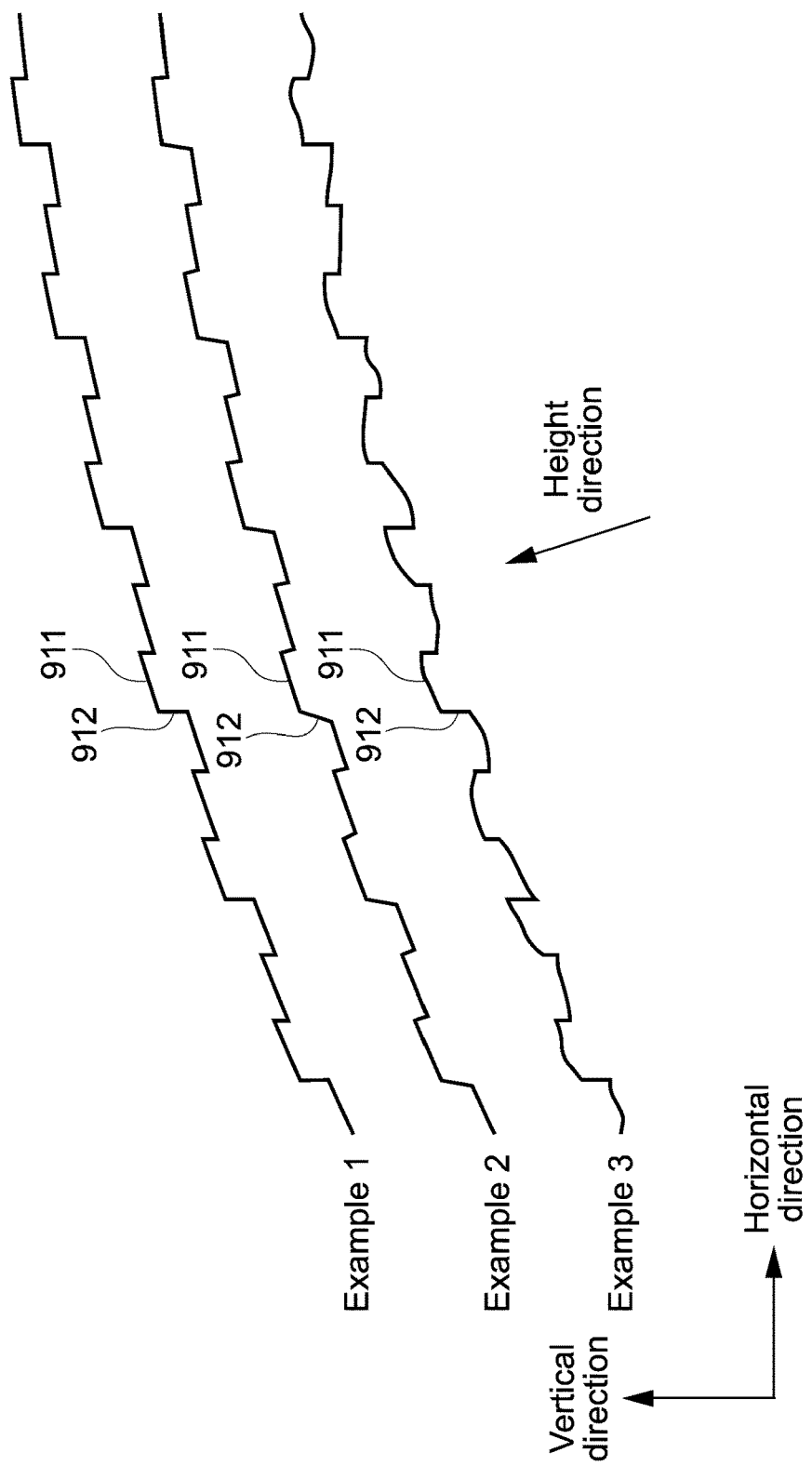

FIG. 14 is a schematic diagram showing a plurality of configuration examples of the plurality of to-be-decorated surfaces formed on a curved surface. For example, there may also be a case where the film 20 shown in FIG. 2 is adhered onto a curved surface portion of the casing portion 101 (also including cases where casing portion is formed by in-mold molding method and insert molding method). Alternatively, the curved surface portion of the casing portion may be set as the to-be-decorated area, and the plurality of to-be-decorated surfaces may be formed in that area. Also in such a case, the present technology is applicable by setting the height direction as appropriate. For example, by setting the height direction in a direction substantially orthogonal to a tangent line of the curved surface portion of the casing portion and forming adjacent to-be-decorated surfaces 911 to have different heights, the effects described above can be exerted. It should be noted that the height direction can be set as appropriate, and an angle thereof (e.g., angle with respect to vertical direction) can also be set as appropriate.

As shown in examples 1 to 3 of FIG. 14, plane directions of the to-be-decorated surfaces 911 do not need to be all the same, and the plane directions of the to-be-decorated surfaces 911 may differ from one another. The plane directions of the to-be-decorated surfaces 911 vary according to the shape of the curved surface of the casing portion as shown in the examples 1 and 2, for example. Alternatively, as shown in the example 3, the to-be-decorated surfaces 911 themselves may be curved. Further, an extension direction of step surfaces 912 connecting the to-be-decorated surfaces 911 having different heights is not limited to the height direction. As shown in the example 3, the step surfaces 912 may be formed as a curve. The same holds true for a case where the plurality of to-be-decorated surfaces are formed on the plane of the casing portion.

In the descriptions above, the film on which the plurality of to-be-decorated surfaces are formed is connected to the casing portion by the in-mold molding method or the insert molding method. The present technology is not limited thereto, and the film may be connected to the casing portion by other methods such as pasting.

Of the feature portions of the embodiments described above, at least two of the feature portions can be combined. In other words, the various feature portions described as the embodiments may be combined arbitrarily without distinguishing the embodiments from one another.

It should be noted that the present technology may also take the following configurations.

(1) A casing component, including:
a to-be-decorated area including a plurality of to-be-decorated surfaces to be decorated, the plurality of to-be-decorated surfaces being formed such that adjacent to-be-decorated surfaces have different heights; and
a decoration portion including a metal layer formed in each of the plurality of to-be-decorated surfaces.

(2) The casing component according to (1), in which
the plurality of to-be-decorated surfaces are formed such that a predetermined direction becomes a height direction, and
the to-be-decorated area includes a step surface that connects the to-be-decorated surfaces having different heights.

(3) The casing component according to (2), in which
the step surface is a surface on which a metal layer is not formed or a surface on which a metal layer thinner than that formed on the to-be-decorated surfaces is formed.

(4) The casing component according to (2) or (3), in which
the step surface extends in the height direction.

(5) The casing component according to any one of (1) to (4), in which
the plurality of to-be-decorated surfaces include a first to-be-decorated surface having a first height, a second to-be-decorated surface having a second height different from the first height, and a third to-be-decorated surface having a third height different from both the first height and the second height.

(6) The casing component according to any one of (1) to (5), in which
the plurality of to-be-decorated surfaces are formed with heights with which, with a predetermined direction being a height direction, the to-be-decorated area becomes substantially the same plane when seeing the to-be-decorated area from the height direction.

(7) The casing component according to (6), in which
the plurality of to-be-decorated surfaces are formed such that planar shapes thereof become substantially the same when seen from the height direction.

(8) The casing component according to (7), in which
the planar shapes are any of a triangle, a rectangle, and a hexagon.

(9) The casing component according to any one of (1) to (8), further including
a base portion,
in which the to-be-decorated area is configured by connecting a film layer on which the plurality of to-be-decorated surfaces are formed to the base portion.

(10) The casing component according to any one of (1) to (8), further including
a base portion,
in which the to-be-decorated area is configured by forming the plurality of to-be-decorated surfaces in a predetermined area of the base portion.

REFERENCE SIGNS LIST 10 metal decoration portion
11, 211, 311, 411, 511, 611, 711, 811, 911 to-be-decorated surface
12 to-be-decorated area
13, 213 metal layer
14, 214 decoration portion 15 antenna unit
18 step surface
20 radio wave transmission film
34 transfer film
100 mobile terminal
101, 201 casing portion
108, 208 back surface portion
215 reflection enhancing film

The invention claimed is:

1. A casing component, comprising:
a to-be-decorated area including:
   a plurality of to-be-decorated surfaces to be decorated, wherein the plurality of to-be-decorated surfaces comprises at least three adjacent to-be-decorated surfaces that have different heights; and
   a step surface that connects the at least three adjacent to-be-decorated surfaces having different heights; and
a decoration portion including a first metal layer on each of the plurality of to-be-decorated surfaces,
wherein the step surface is one of a surface on which a metal layer is not formed or a surface on which a second metal layer thinner than the first metal layer is formed.

2. The casing component according to claim 1, wherein the plurality of to-be-decorated surfaces are formed such that a determined direction becomes a height direction.

3. The casing component according to claim 2, wherein the step surface extends in the height direction.

4. The casing component according to claim 1, wherein the plurality of to-be-decorated surfaces are formed with heights with which the to-be-decorated area becomes the same plane when seen from a height direction.

5. The casing component according to claim 4, wherein the plurality of to-be-decorated surfaces are formed such that planar shapes thereof become the same when seen from the height direction.

6. The casing component according to claim 5, wherein the planar shapes are one of a triangle, a rectangle, and a hexagon.

7. The casing component according to claim 1, further comprising a base portion, wherein the to-be-decorated area comprises a film layer connected to the base portion, wherein the plurality of to-be-decorated surfaces are on the film layer.

8. The casing component according to claim 1, further comprising a base portion, wherein the to-be-decorated area comprises the plurality of to-be-decorated surfaces in a determined area of the base portion.

9. An electronic apparatus, comprising:
a casing portion including:
   a to-be-decorated area including:
      a plurality of to-be-decorated surfaces to be decorated, wherein the plurality of to-be-decorated surfaces comprises at least three adjacent to-be-decorated surfaces have different heights; and
      a step surface that connects the at least three adjacent to-be-decorated surfaces having different heights; and
   a decoration portion including a first metal layer on each of the plurality of to-be-decorated surfaces, wherein the step surface is one of a surface on which a metal layer is not formed or a surface on which a second metal layer thinner than the first metal layer is formed; and
an electronic component in the casing portion.

10. The electronic apparatus according to claim 9, wherein the electronic component includes an antenna unit inside the to-be-decorated area.

11. A casing component production method, comprising:
forming a plurality of to-be-decorated surfaces to be decorated on a transfer film, wherein the plurality of to-be-decorated surfaces is formed such that three or more adjacent to-be-decorated surfaces of the plurality of to-be-decorated surfaces have different heights;
forming a decoration portion including a metal layer on each of the plurality of to-be-decorated surfaces; and
forming a molding component such that the plurality of to-be-decorated surfaces formed on the transfer film are transferred by an in-mold molding method.

12. A casing component production method, comprising:
forming a plurality of to-be-decorated surfaces to be decorated on an insert film, wherein the plurality of to-be-decorated surfaces is formed such that three or more adjacent to-be-decorated surfaces of the plurality of to-be-decorated surfaces have different heights;
forming a decoration portion including a metal layer on each of the plurality of to-be-decorated surfaces; and
forming a molding component integrally with the insert film on which the plurality of to-be-decorated surfaces are formed by an insert molding method.

13. A casing component production method, comprising:
forming a to-be-decorated area, including a plurality of to-be-decorated surfaces to be decorated and a step surface, on a base portion, wherein the plurality of to-be-decorated surfaces is formed such that at least three adjacent to-be-decorated surfaces of the plurality of to-be-decorated surfaces have different heights; and
forming a decoration portion including a first metal layer on each of the plurality of to-be-decorated surfaces, wherein
the step surface connects the at least three adjacent to-be-decorated surfaces having different heights, and
the step surface is one of a surface on which a metal layer is not formed or a surface on which a second metal layer thinner than the first metal layer is formed.

14. A casing component, comprising:
a to-be-decorated area including:
   a plurality of to-be-decorated surfaces to be decorated, wherein the plurality of to-be-decorated surfaces comprises at least three adjacent to-be-decorated surfaces that have different heights, wherein the plurality of to-be-decorated surfaces are formed such that a predetermined direction becomes a height direction; and
   a step surface that connects the at least three adjacent to-be-decorated surfaces having different heights, wherein the step surface is a surface on which a discontinuous metal layer is formed; and
a decoration portion including a metal layer on each of the plurality of to-be-decorated surfaces.

* * * * *